US012615017B2

(12) United States Patent
Hellberg

(10) Patent No.: US 12,615,017 B2
(45) Date of Patent: Apr. 28, 2026

(54) AMPLIFIER CIRCUITS AND METHODS OF OPERATING AN AMPLIFIER CIRCUIT

(71) Applicant: Telefonaktiebolaget LM Ericsson (publ), Stockholm (SE)

(72) Inventor: Richard Hellberg, Huddinge (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 761 days.

(21) Appl. No.: 17/794,722

(22) PCT Filed: Mar. 23, 2020

(86) PCT No.: PCT/SE2020/050300
§ 371 (c)(1),
(2) Date: Jul. 22, 2022

(87) PCT Pub. No.: WO2021/194397
PCT Pub. Date: Sep. 30, 2021

(65) Prior Publication Data
US 2023/0065760 A1       Mar. 2, 2023

(51) Int. Cl.
*H03F 1/02*        (2006.01)
*H03F 3/06*        (2006.01)
(Continued)

(52) U.S. Cl.
CPC ........... *H03F 1/0288* (2013.01); *H03F 3/245* (2013.01); *H03F 3/604* (2013.01); (Continued)

(58) Field of Classification Search
CPC ........ H03F 1/0288; H03F 3/245; H03F 3/604; H03F 2200/192; H03F 2200/198; (Continued)

(56) References Cited

U.S. PATENT DOCUMENTS 12,231,090 B2 *    2/2025    Chen .......................... H03F 1/42
2002/0167722 A1   11/2002   Willner et al.
(Continued)

FOREIGN PATENT DOCUMENTS

EP        2849277 A1      3/2015
WO      03038995 A1      5/2003
(Continued)

OTHER PUBLICATIONS

Pednekar, P. et al., "Analysis and Design of a Doherty-Like RF-Input Load Modulated Balanced Amplifier", IEEE Transactions on Microwave Theory and Techniques, vol. 66 No. 12, Dec. 1, 2018, pp. 5322-5335, IEEE.
(Continued)

*Primary Examiner* — Hieu P Nguyen
(74) *Attorney, Agent, or Firm* — COATS & BENNETT, PLLC

(57) ABSTRACT

Methods and apparatus are provided. In an example aspect, a method of operating an amplifier circuit is provided. The amplifier circuit comprises a first amplifier configured to receive a first signal, a balanced amplifier comprising second and third amplifiers and configured to receive a second signal, and a first directional coupler. An output of the first amplifier is connected to a transmitted port of the first directional coupler, an output of the second amplifier is connected to an input port of the first directional coupler, an output of the third amplifier is connected to an isolated port of the first directional coupler, and a coupled port of the first directional coupler is connected to an output of the amplifier circuit. The method comprises operating the amplifier circuit in a first output peak amplitude range of the amplifier circuit wherein, in the first output peak amplitude range, the first signal is based on a signal to be amplified and has an amplitude that increases across the first output peak ampli- (Continued)

Operating the amplifier circuit in a first output peak amplitude range of the amplifier circuit wherein, in the first output peak amplitude range, the first signal is based on a signal to be amplified and has an amplitude that increases across the first output peak amplitude range from substantially zero to a first amplitude, and the second signal is substantially zero
⌇602

Operating the amplifier circuit in a second output peak amplitude range of the amplifier circuit, wherein the second output peak amplitude range is higher than the first output peak amplitude range and wherein, in the second output peak amplitude range, the first signal is based on the signal to be amplified and has an amplitude that decreases across the second output peak amplitude range from the first amplitude to a second amplitude, and the second signal is based on the signal to be amplified and has an amplitude that increases across the second output peak amplitude range from a third amplitude to a fourth amplitude
⌇604

600 tude range from substantially zero to a first amplitude, and the second signal is substantially zero, and operating the amplifier circuit in a second output peak amplitude range of the amplifier circuit, wherein the second output peak amplitude range is higher than the first output peak amplitude range and wherein, in the second output peak amplitude range, the first signal is based on the signal to be amplified and has an amplitude that decreases across the second output peak amplitude range from the first amplitude to a second amplitude, and the second signal is based on the signal to be amplified and has an amplitude that increases across the second output peak amplitude range from a third amplitude to a fourth amplitude.

20 Claims, 8 Drawing Sheets

(51) Int. Cl.
  *H03F 3/24*      (2006.01)
  *H03F 3/60*      (2006.01)
(52) U.S. Cl.
  CPC .. *H03F 2200/192* (2013.01); *H03F 2200/198* (2013.01); *H03F 2200/204* (2013.01); *H03F 2200/451* (2013.01)
(58) Field of Classification Search
  CPC ......... H03F 2200/204; H03F 2200/451; H03F 2200/387; H03F 2200/222; H03F 2200/537; H03F 2200/541

USPC .................. 330/10, 251, 207 A, 124 R, 295
See application file for complete search history.

(56)              References Cited

U.S. PATENT DOCUMENTS

| | | | |
|---|---|---|---|
| 2002/0171477 A1 | 11/2002 | Nakayama et al. | |
| 2005/0134377 A1* | 6/2005 | Dent ..................... | H03F 1/0288 |
| | | | 330/124 R |
| 2018/0205348 A1 | 7/2018 | Barton et al. | |

FOREIGN PATENT DOCUMENTS

| | | |
|---|---|---|
| WO | 2005031966 A1 | 4/2005 |
| WO | 2007078217 A1 | 7/2007 |
| WO | 2011134905 A1 | 11/2011 |
| WO | 2016182485 A1 | 11/2016 |
| WO | 2019091541 A1 | 5/2019 |
| WO | 2021167508 A1 | 8/2021 |

OTHER PUBLICATIONS

Shepphard, D. et al., "An Efficient Broadband Reconfigurable Power Amplifier Using Active Load Modulation", IEEE Microwave and Wireless Components Letters, vol. 26 No. 6, Jun. 1, 2016, pp. 443-445, IEEE.

* cited by examiner

100

200

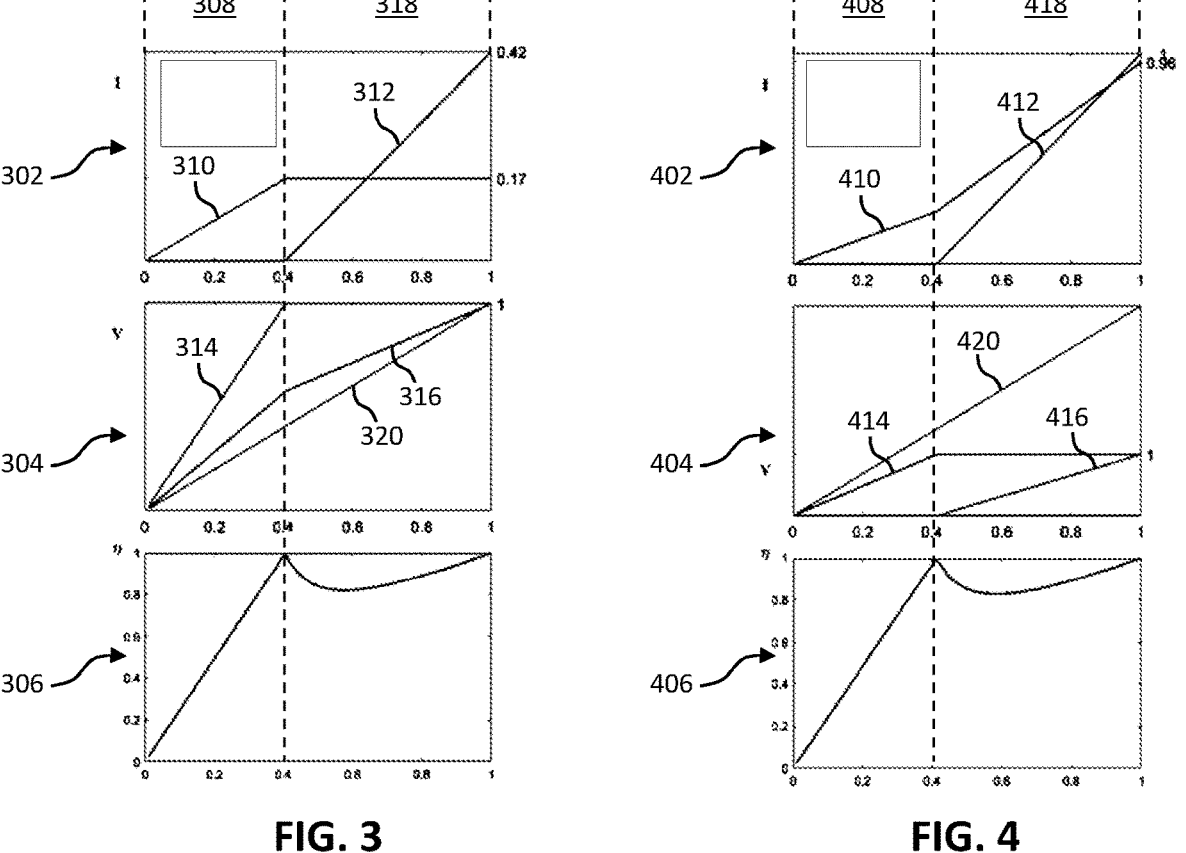
FIG. 3                        FIG. 4

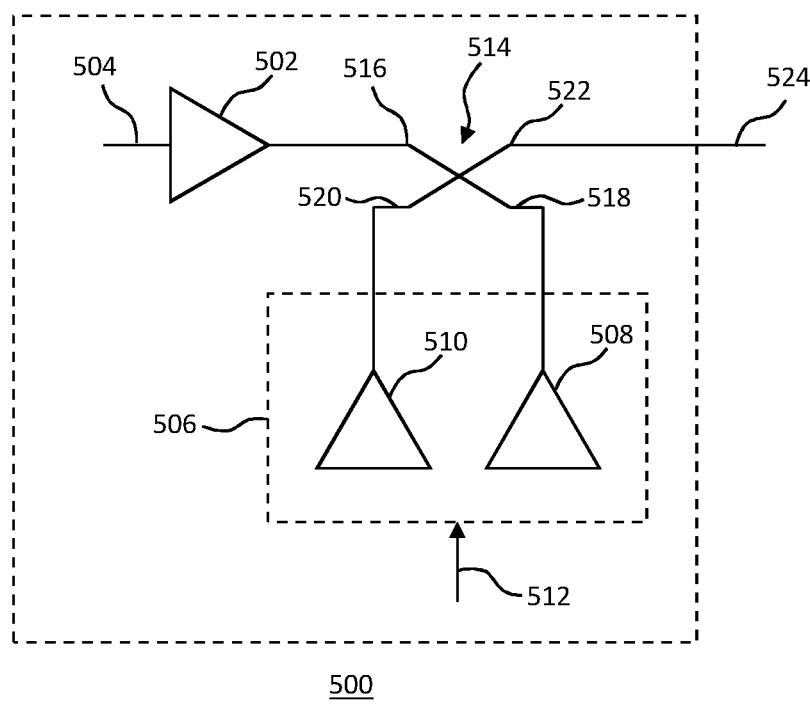

| |
|---|
| Operating the amplifier circuit in a first output peak amplitude range of the amplifier circuit wherein, in the first output peak amplitude range, the first signal is based on a signal to be amplified and has an amplitude that increases across the first output peak amplitude range from substantially zero to a first amplitude, and the second signal is substantially zero |

602

| |
|---|
| Operating the amplifier circuit in a second output peak amplitude range of the amplifier circuit, wherein the second output peak amplitude range is higher than the first output peak amplitude range and wherein, in the second output peak amplitude range, the first signal is based on the signal to be amplified and has an amplitude that decreases across the second output peak amplitude range from the first amplitude to a second amplitude, and the second signal is based on the signal to be amplified and has an amplitude that increases across the second output peak amplitude range from a third amplitude to a fourth amplitude |

Figure 10:
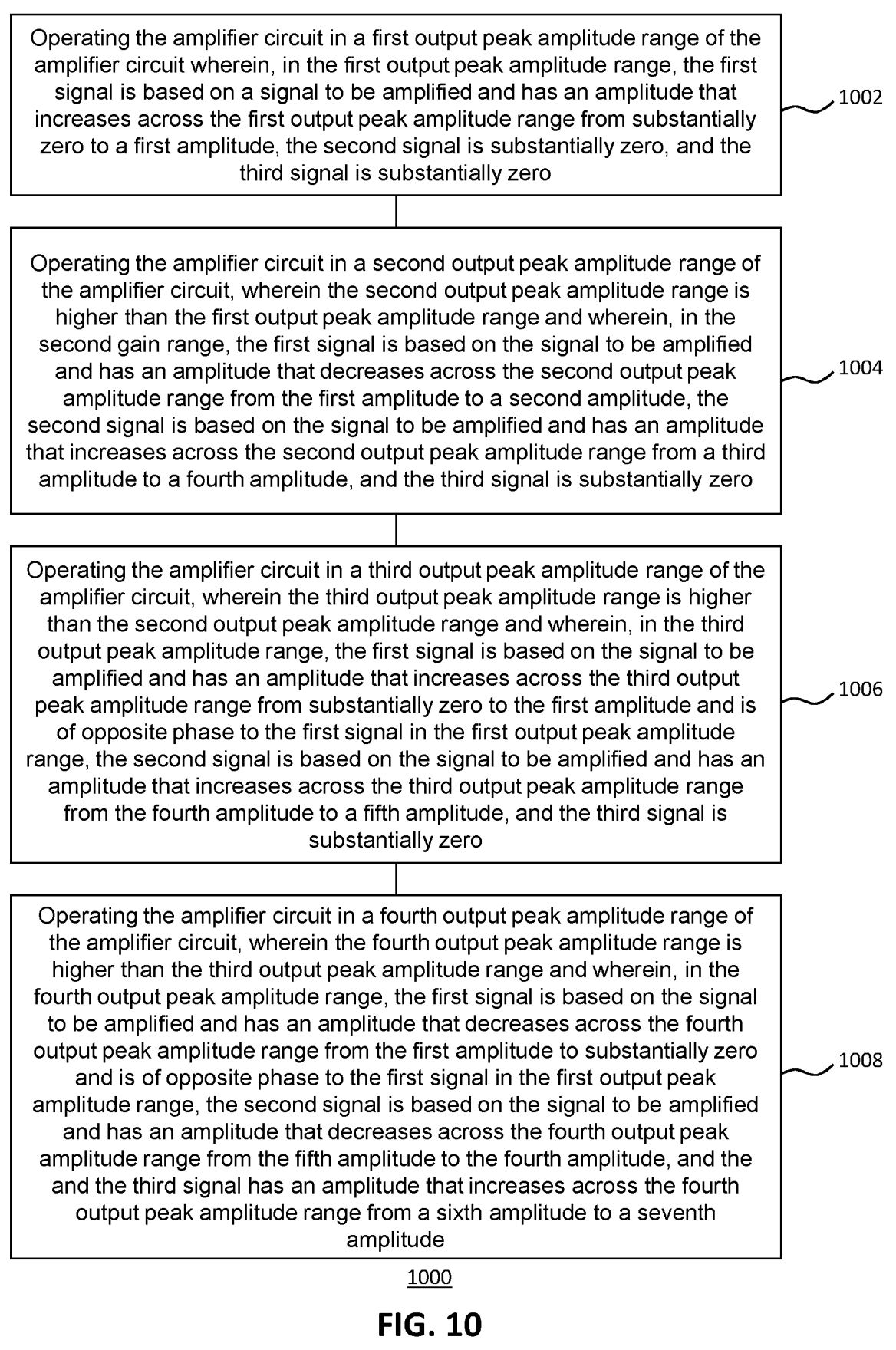

Operating the amplifier circuit in a first output peak amplitude range of the amplifier circuit wherein, in the first output peak amplitude range, the first signal is based on a signal to be amplified and has an amplitude that increases across the first output peak amplitude range from substantially zero to a first amplitude, the second signal is substantially zero, and the third signal is substantially zero

1002

Operating the amplifier circuit in a second output peak amplitude range of the amplifier circuit, wherein the second output peak amplitude range is higher than the first output peak amplitude range and wherein, in the second gain range, the first signal is based on the signal to be amplified and has an amplitude that decreases across the second output peak amplitude range from the first amplitude to a second amplitude, the second signal is based on the signal to be amplified and has an amplitude that increases across the second output peak amplitude range from a third amplitude to a fourth amplitude, and the third signal is substantially zero

1004

Operating the amplifier circuit in a third output peak amplitude range of the amplifier circuit, wherein the third output peak amplitude range is higher than the second output peak amplitude range and wherein, in the third output peak amplitude range, the first signal is based on the signal to be amplified and has an amplitude that increases across the third output peak amplitude range from substantially zero to the first amplitude and is of opposite phase to the first signal in the first output peak amplitude range, the second signal is based on the signal to be amplified and has an amplitude that increases across the third output peak amplitude range from the fourth amplitude to a fifth amplitude, and the third signal is substantially zero

1006

Operating the amplifier circuit in a fourth output peak amplitude range of the amplifier circuit, wherein the fourth output peak amplitude range is higher than the third output peak amplitude range and wherein, in the fourth output peak amplitude range, the first signal is based on the signal to be amplified and has an amplitude that decreases across the fourth output peak amplitude range from the first amplitude to substantially zero and is of opposite phase to the first signal in the first output peak amplitude range, the second signal is based on the signal to be amplified and has an amplitude that decreases across the fourth output peak amplitude range from the fifth amplitude to the fourth amplitude, and the and the third signal has an amplitude that increases across the fourth output peak amplitude range from a sixth amplitude to a seventh amplitude

AMPLIFIER CIRCUITS AND METHODS OF OPERATING AN AMPLIFIER CIRCUIT

TECHNICAL FIELD

Examples of the present disclosure relate to an amplifier circuits and methods of operating amplifier circuits.

BACKGROUND

Load modulated balanced amplifiers (LMBA) are power amplifiers (PA) that have high efficiency at low (backed off) amplitudes. Their efficiency vs amplitude curves may demonstrate an efficiency maximum at a backed off amplitude point. They may be similar to a traditional balanced amplifier (BA) but with a signal source instead of a resistive termination at one port of an output side 3-dB 90-degree hybrid (e.g. hybrid coupler). LMBAs operate in two distinct modes, separated in amplitude at certain level called the transition point.

A circuit diagram of an example of a LMBA 100 with field coupled line hybrids is shown in FIG. 1. The hybrid 102 on the input side splits the RF input signal 104 into two signals with 90 degrees phase difference at the gates of transistors 106 and 108. This makes the transistor output signals interfere constructively at the output port of the output hybrid, connected to the load resistance 110, and destructively at the control signal port 112. This is similar to a traditional balanced amplifier.

Where the traditional BA has a resistive termination, the LMBA 100 has a control signal input 112. The amplifier 114 that provides the control signal is called the control amplifier (CA). The control signal passes through the output hybrid coupler 116 to the load 110 by splitting in the hybrid 116, reflecting off the transistors 106 and 108 in the BA, and recombining in the hybrid 116. Since the control signal reflects off the transistors 106 and 108, it causes an additional voltage swing at the outputs of the BA transistors that makes their effective load resistances change. This is called load modulation. Since the 3-dB hybrid coupler 116 splits the control signal in two equal parts, the load modulation is equal at the two BA transistors 106 and 108.

A circuit diagram of a more detailed example of a LMBA 200 is shown in FIG. 2, with branchline type 3-dB hybrids, control amplifier 206, RF input signal split 208, and input and output matching networks (input matching network, IMN, and output matching network, OMN) for all transistors 206, 210 and 212.

In prior art there are two variants of the LMBAs 100 or 200, distinguished by the order in LMBA output amplitude in which the amplifier parts (balanced amplifier and control amplifier) are used. In the first variant [1] the control amplifier (CA) is used alone in a first mode at amplitudes below the transition point. In the second variant [2] the BA is used alone in a first mode below the transition point. In both variants, the BA and CA are used together in their second mode above the transition point, but the two variants' second modes entail different behaviors of the amplifier parts, as explained further below. The upper ends of both modes, i.e. the transition point and the full output amplitude point, both correspond to a maximum in the efficiency curve.

The transition point amplitude determines the relative maximum output powers of the transistors in the BA and CA. For a transition point at low amplitude, the first variant has a small CA and a large BA. The second variant instead has a smaller BA and a larger CA. This difference is also reflected in different impedance or voltage swing levels in different parts of the system and can thus also be seen in transformation ratios and/or supply voltage ratios.

The operation of the first variant of the LMBA 100 or 200 is shown in FIG. 3. This shows a graph of output currents 302, output voltages 304 and efficiency 306 of the LMBA and the BA and CA parts. Normalized LMBA output amplitude is shown on the horizontal axis. The LMBA 100 and 200 may in some examples be considered as a substantially fixed gain amplifier whereby the output gain is controlled by controlling the level of the input signals. In a first mode 308, for a normalized LMBA output amplitude of between 0 and around 0.4, the input signal to the control amplifier is controlled such that the output current 310 rises in a linear manner to around 0.17 A in this example, and the input signal to the balanced amplifier remains at substantially zero, such that the current output 312 of the BA remains at substantially zero. The resulting (normalized) output voltages 314 and 316 respectively of the CA and BA are also shown. In the second mode 318, the input signals are controlled such that the current output 310 of the CA remains constant (in this example at around 0.17 A) and the current output 312 of the BA rises in a linear manner from zero to around 0.42 A in this example. The overall voltage output 320 from the LMBA is approximately linear across the output range. It can be seen from the (normalized) efficiency graph 306 that there is an efficiency maximum at the upper end of both modes, that is around 0.4 and 1 of the normalized output amplitude.

The operation of the second variant of the LMBA 100 or 200 is shown in FIG. 4. This shows a graph of output currents 402, output voltages 404 and efficiency 406 of the LMBA and the BA and CA parts. Normalized LMBA output amplitude is shown on the horizontal axis. The LMBA 100 and 200 may in some examples be considered as a substantially fixed gain amplifier whereby the output gain is controlled by controlling the level of the input signals. In a first mode 408, for a normalized LMBA output amplitude of between 0 and around 0.4, the input signal to the BA is controlled such that the output current 410 rises in a linear manner to around 0.2 A in this example, and the input signal to the CA is controlled such that the current output 412 of the CA remains at substantially zero. The resulting (normalized) output voltages 414 and 416 respectively of the CA and BA are also shown. In the second mode 418, the input signals are controlled such that the current output 410 of the BA rises in a linear fashion to around 0.96 A in this example, and the current output 412 of the CA rises in a linear manner from zero to around 1 A in this example. The overall voltage output 420 from the LMBA is approximately linear across the output range. It can be seen from the (normalized) efficiency graph 406 that there is an efficiency maximum at the upper end of both modes, that is around 0.4 and 1 of the normalized output amplitude It can be seen that for both variants, the first variant illustrated in FIG. 3 and the second variant illustrated in FIG. 4, the first modes are similar in behavior with a single amplifier part (CA or BA) operating alone up to the transition point, at which its voltage swing is at maximum amplitude. The second modes are however different between the variants. The first variant's CA current is at constant amplitude in the second mode, while the second variant's BA currents increase even more with increasing amplitude in the second mode. The two LMBA variants (or the two variants of LMBA operation) may have the same supply voltage to all transistors. In an example implementations the first variant may have an impedance transformation down of 6 times from the CA to the BA, and the second variant may have a transformation up of 4 times from the CA to the BA. The normalized efficiency curves are similar for both cases, but the voltage and current curve shapes and the relative maximum output powers differ.

SUMMARY

One aspect of the present disclosure provides a method of operating an amplifier circuit. The amplifier circuit comprises a first amplifier configured to receive a first signal, a balanced amplifier comprising second and third amplifiers and configured to receive a second signal, and a first directional coupler. An output of the first amplifier is connected to a transmitted port of the first directional coupler, an output of the second amplifier is connected to an input port of the first directional coupler, an output of the third amplifier is connected to an isolated port of the first directional coupler, and a coupled port of the first directional coupler is connected to an output of the amplifier circuit. The method comprises operating the amplifier circuit in a first output peak amplitude range of the amplifier circuit wherein, in the first output peak amplitude range, the first signal is based on a signal to be amplified and has an amplitude that increases across the first output peak amplitude range from substantially zero to a first amplitude, and the second signal is substantially zero, and operating the amplifier circuit in a second output peak amplitude range of the amplifier circuit, wherein the second output peak amplitude range is higher than the first output peak amplitude range and wherein, in the second output peak amplitude range, the first signal is based on the signal to be amplified and has an amplitude that decreases across the second output peak amplitude range from the first amplitude to a second amplitude, and the second signal is based on the signal to be amplified and has an amplitude that increases across the second output peak amplitude range from a third amplitude to a fourth amplitude.

A further aspect of the present disclosure provides a method of operating an amplifier circuit. The amplifier circuit comprises a first amplifier configured to receive a first signal, a first balanced amplifier comprising second and third amplifiers and configured to receive a second signal, and a first directional coupler. An output of the first amplifier is connected to a transmitted port of the first directional coupler, an output of the second amplifier is connected to an input port of the first directional coupler, and an output of the third amplifier is connected to an isolated port of the first directional coupler. The amplifier circuit also comprises a second balanced amplifier comprising fourth and fifth amplifiers and configured to receive a third signal, and a second directional coupler. A coupled port of the first directional coupler is connected to a transmitted port of the second directional coupler, an output of the fourth amplifier is connected to an input port of the second directional coupler, an output of the fifth amplifier is connected to an isolated port of the second directional coupler, and a coupled port of the second directional coupler is connected to an output of the amplifier circuit. The method comprises operating the amplifier circuit in a first output peak amplitude range of the amplifier circuit wherein, in the first output peak amplitude range, the first signal is based on a signal to be amplified and has an amplitude that increases across the first output peak amplitude range from substantially zero to a first amplitude, the second signal is substantially zero, and the third signal is substantially zero, operating the amplifier circuit in a second output peak amplitude range of the amplifier circuit, wherein the second output peak amplitude range is higher than the first output peak amplitude range and wherein, in the second output peak amplitude range, the first signal is based on the signal to be amplified and has an amplitude that decreases across the second output peak amplitude range from the first amplitude to a second amplitude, the second signal is based on the signal to be amplified and has an amplitude that increases across the second output peak amplitude range from a third amplitude to a fourth amplitude, and the third signal is substantially zero, operating the amplifier circuit in a third output peak amplitude range of the amplifier circuit, wherein the third output peak amplitude range is higher than the second output peak amplitude range and wherein, in the third output peak amplitude range, the first signal is based on the signal to be amplified and has an amplitude that increases across the third output peak amplitude range from substantially zero to the first amplitude and is of opposite phase to the first signal in the first output peak amplitude range, the second signal is based on the signal to be amplified and has an amplitude that increases across the third output peak amplitude range from the fourth amplitude to a fifth amplitude, and the third signal is substantially zero, and operating the amplifier circuit in a fourth output peak amplitude range of the amplifier circuit, wherein the fourth output peak amplitude range is higher than the third output peak amplitude range and wherein, in the fourth output peak amplitude range, the first signal is based on the signal to be amplified and has an amplitude that decreases across the fourth output peak amplitude range from the first amplitude to substantially zero and is of opposite phase to the first signal in the first output peak amplitude range, the second signal is based on the signal to be amplified and has an amplitude that decreases across the fourth output peak amplitude range from the fifth amplitude to the fourth amplitude, and the and the third signal has an amplitude that increases across the fourth output peak amplitude range from a sixth amplitude to a seventh amplitude.

An additional aspect of the present disclosure provides an amplifier circuit configured to operate in accordance with any of the above methods.

BRIEF DESCRIPTION OF THE DRAWINGS

For a better understanding of examples of the present disclosure, and to show more clearly how the examples may be carried into effect, reference will now be made, by way of example only, to the following drawings in which:

FIG. 3 shows graphs of signals in a first variant of operation of a LMBA;

FIG. 4 shows graphs of signals in a second variant of operation of a LMBA;

FIG. 5 is an example of an amplifier circuit;

FIG. 6 is a flow chart of an example of a method of operating an amplifier circuit;

FIG. 10 is a flow chart of an example of another method of operating an amplifier circuit;

DETAILED DESCRIPTION

Figure 1:
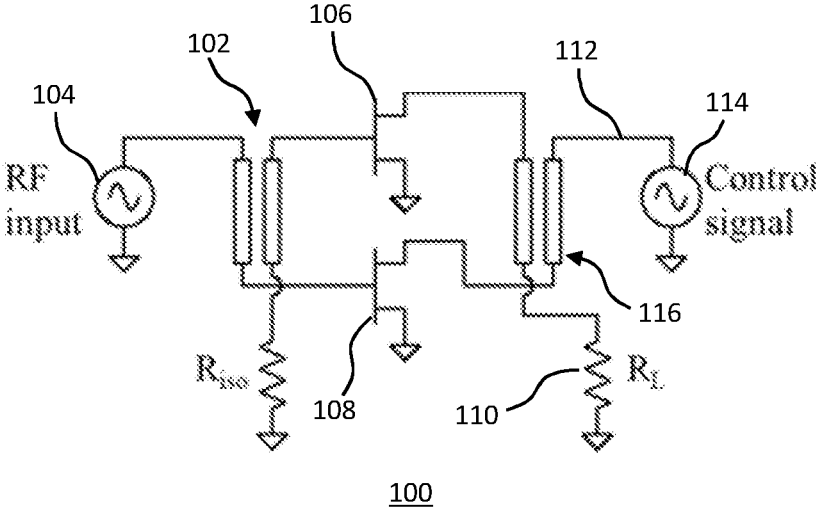
FIG. 1 is a circuit diagram of an example of a load modulated balanced amplifier (LMBA)
Figure 2:
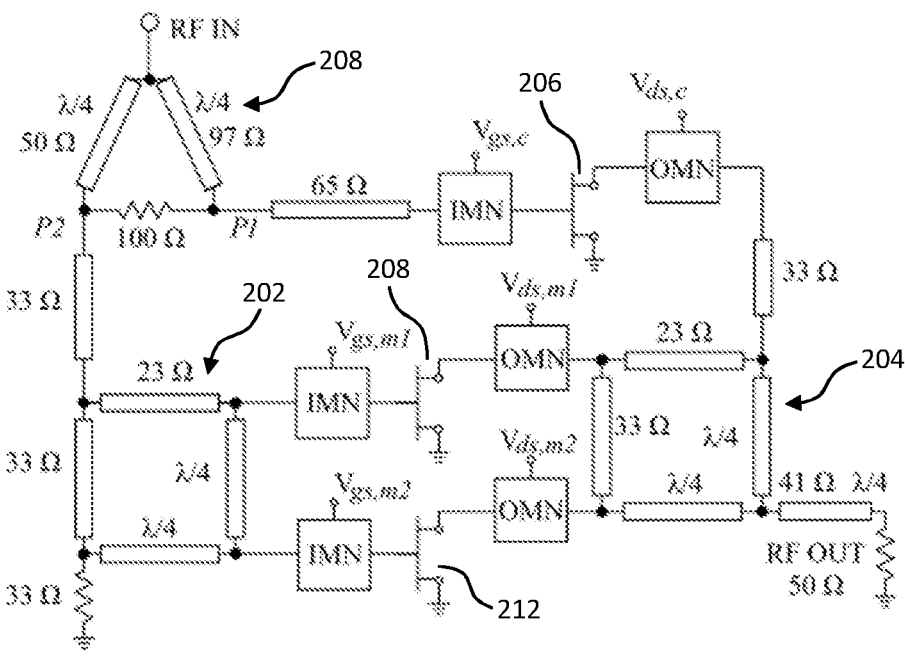
FIG. 2 is a circuit diagram of a more detailed example of a LMBA.

The following sets forth specific details, such as particular embodiments or examples for purposes of explanation and not limitation. It will be appreciated by one skilled in the art that other examples may be employed apart from these specific details. In some instances, detailed descriptions of well-known methods, nodes, interfaces, circuits, and devices are omitted so as not obscure the description with unnecessary detail. Those skilled in the art will appreciate that the functions described may be implemented in one or more nodes using hardware circuitry (e.g., analog and/or discrete logic gates interconnected to perform a specialized function, ASICs, PLAs, etc.) and/or using software programs and data in conjunction with one or more digital microprocessors or general purpose computers. Nodes that communicate using the air interface also have suitable radio communications circuitry.

Moreover, where appropriate the technology can additionally be considered to be embodied entirely within any form of computer-readable memory, such as solid-state memory, magnetic disk, or optical disk containing an appropriate set of computer instructions that would cause a processor to carry out the techniques described herein.

Hardware implementation may include or encompass, without limitation, digital signal processor (DSP) hardware, a reduced instruction set processor, hardware (e.g., digital or analogue) circuitry including but not limited to application specific integrated circuit(s) (ASIC) and/or field programmable gate array(s) (FPGA(s)), and (where appropriate) state machines capable of performing such functions.

With prior art amplifiers, such as for example LMBAs such as the LMBAs 100 and 200 described above, and also other amplifier types such as Doherty and Chireix types, there is only one extra efficiency maximum per added stage, i.e. the number of efficiency maxima grows only linearly with the number of stages. This means that a lot of stages are needed to get high efficiency in a wide amplitude range. For an efficiency maximum at low amplitude, the impedance ratio or voltage swing ratio between different parts of the prior art amplifiers (including LMBAs, Doherty and Chireix amplifiers) is large. For example, placing the efficiency maximum at 0.25 of full amplitude, i.e. at –12 dB, requires an impedance ratio of 12.5 times for the first variant of a LMBA [1], and 18 times for the second variant [2], if all transistors have the same supply voltage. A large impedance transformation ratio between different points in the system means that the impedance transformers are longer and more lossy. It also means that reverse waves from reflections, antenna-to-antenna leakage or external interferers are potentially transformed to very high voltage levels which can lead to breakdown and other problems such as distortion and loss of output power Examples of this disclosure include amplifier circuits and methods of operating amplifier circuits. Herein an amplifier circuit means a circuit that could itself be an amplifier or be used as an amplifier, but may contain one or more other amplifiers, amplifier circuits and/or amplifier stages. The terms amplifier and amplifier circuit may in some examples be interchangeable.

Examples of this disclosure may use the control amplifier in an amplifier such as for example a LMBA in a number different amplitude-varying modes, as opposed to for example only one mode in prior art LMBAs. In some examples, an amplifier or amplifier circuit that includes a BA and a CA may be operated in one or more of the following modes, in order of lowest output amplitude to highest output amplitude: 1) the CA ramping up to its maximum amplitude by itself, 2) the CA staying at maximum amplitude, and the BA ramping up to its maximum voltage swing (but not maximum current), 3) the CA ramping down in amplitude to zero while the BA ramps up with increased slope, and 4) the CA ramping up to maximum amplitude again but with 180 degrees reversed phase while the BA continues ramping up. The upper amplitude point of each of these modes may provide a maximum in the efficiency curve in some examples.

In some examples, another BA stage (e.g. referred to as BA2) may be added after the CA and BA. In this case, the three different CA modes of operation can be applied to the combined CA and BA, with BA2 operating as a regular BA stage. In other words, in some examples, the CA itself may comprise an amplifier circuit (e.g. a LMBA) operated in accordance with methods as disclosed herein. This may increase the number of efficiency maxima of the amplifier circuit, and may in some examples provide at least one additional efficiency maximum for a further mode when the added BA2 output amplitude ramps up and the combined preceding stages stay at constant amplitude. This can be repeated by adding more BA stages. In some examples, the extra modes may give rise to many more efficiency maxima at different amplitudes. For two stages, for example, there may be up to four possible modes and thus four possible efficiency maxima. For three stages, for example, there may be up to 13 possible modes and efficiency maxima. For four stages, for example, there may be up to 40 possible modes and efficiency maxima. The number of efficiency maxima may thus in some examples increase by a factor of up to more than 3 per added stage, i.e. may grow exponentially with the number of stages, if an appropriate number of modes are utilized.

FIG. 5 is an example of an amplifier circuit 500 on which example methods of this disclosure may be utilized. That is, for example, example methods of operating an amplifier circuit as disclosed herein may be performed on the amplifier circuit 500. The amplifier circuit 500 comprises a first amplifier 502 configured to receive a first signal 504, and a balanced amplifier 506 comprising second and third amplifiers 508 and 510 and configured to receive a second signal 512. The amplifier circuit 500 also comprises a first directional coupler 514. An output of the first amplifier 502 is connected to a transmitted port 516 of the first directional coupler 514. An output of the second amplifier 508 is connected to an input port 518 of the first directional coupler 514. An output of the third amplifier 510 is connected to an isolated port 520 of the first directional coupler 514, and a coupled port 522 of the first directional coupler 514 is connected to an output 524 of the amplifier circuit 500. The output 524 may provide for example an amplified signal. In some examples, the second signal 512 is provided to the amplifiers 508 and 510 with a 90 degree phase difference, or alternatively signals based on the second signal 512 are provided to the amplifiers 508 and 510 with a 90 degree phase difference between them.

FIG. 6 is a flow chart of an example of a method 600 of operating an amplifier circuit, such as for example the amplifier or amplifier circuit 100, 200 or 500 described above. Step 602 of the method comprises operating the amplifier circuit (e.g. amplifier circuit 500) in a first output peak amplitude range of the amplifier circuit wherein, in the first output peak amplitude range, the first signal 504 is based on a signal to be amplified and has an amplitude that increases across the first output peak amplitude range from substantially zero to a first amplitude, and the second signal 512 is substantially zero.

Figure 7:
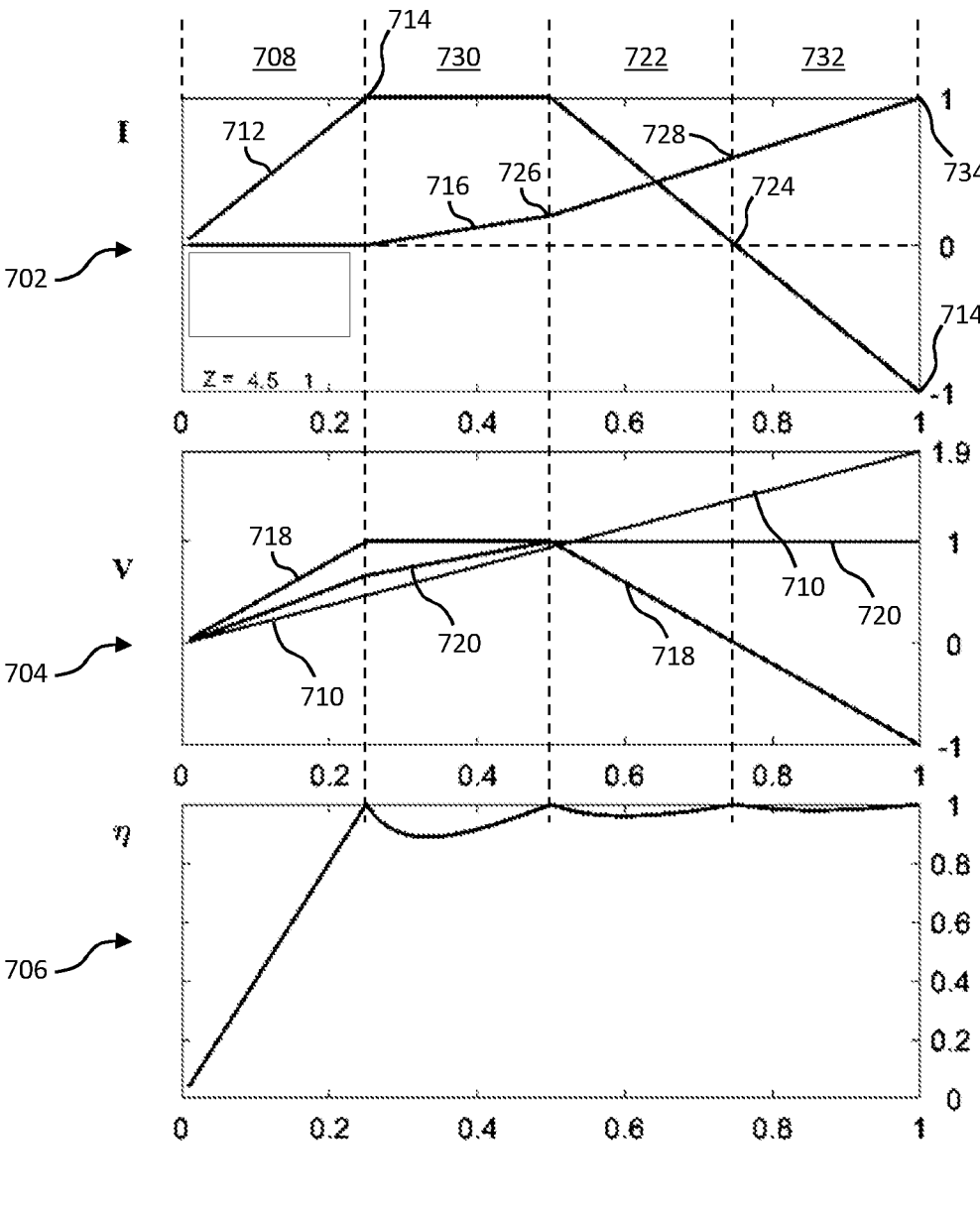
FIG. 7 is a graph showing an example of signals in an amplifier circuit during operation in accordance with the method of FIG. 6.

FIG. 7 is a graph showing an example of signals in the amplifier circuit during operation in accordance with the method 600. In particular, the signals and graphs shown include currents 702, voltages 704 and efficiency 706 in the amplifier circuit. In the first output peak amplitude range 708 (as shown by amplifier circuit output voltage 710), the first signal 504 (as shown by current signal 712) has an amplitude that increases across the first output peak amplitude range from substantially zero to a first amplitude 714. The first signal 712 is also based on an amplifier input signal. That is, for example, the amplifier input signal is a signal to be amplified and be provided as the amplified output signal 524, and the first signal 712 may be an amplified, scaled or otherwise manipulated version of the amplifier input signal. In some examples, the amplifier input signal may be produced from a digital signal, e.g. may be provided from a digital to analogue converter (DAC). In the first output peak amplitude range 708, the second signal 512 (as shown by current signal 716) is substantially zero. Voltage output from the first amplifier 502 (which in some examples may be a control amplifier or load modulating amplifier) is shown as voltage signal 718, and voltage output from the balanced amplifier 506 is shown as voltage signal 720.

Referring back to FIG. 6, the method 600 includes, in step 604, operating the amplifier circuit 500 in a second output peak amplitude range 722 of the amplifier circuit 500, wherein the second output peak amplitude range is higher than the first output peak amplitude range and wherein, in the second output peak amplitude range, the first signal 504 is based on the signal to be amplified and has an amplitude that decreases across the second output peak amplitude range from the first amplitude 714 to a second amplitude 724 (which in this example is zero), and the second signal 512 is based on the signal to be amplified and has an amplitude that increases across the second output peak amplitude range from a third amplitude 726 to a fourth amplitude 728. The second output peak amplitude range is shown in FIG. 7 as range 722, and the corresponding current and voltage signals in the amplifier circuit 500 can be seen. This may for example removes the voltage swing contribution by the first amplifier at the balanced amplifier, which may give more room for the voltage caused by the BA's own current. This means for example that the BA can ramp up its current until it provides all output power by itself, which in a particular example is 9 W.

As shown by the efficiency graph 706, there is an efficiency maximum at the upper end of both the first and second ranges 708 and 722. FIG. 7 shows other ranges 730 and 732, though in some examples the ranges 730 and/or 732 are not present. In cases where range 730 is not present, the first and second ranges 708 and 722 may be contiguous, and the third amplitude 726 may be substantially zero.

In some examples, the method 600 may further comprise operating the amplifier circuit in a third output peak amplitude range 732 of the amplifier circuit 500, wherein the third output peak amplitude range is higher than the second output peak amplitude range and wherein, in the third output peak amplitude range 732, the first signal 504 is based on the signal to be amplified and has an amplitude that increases across the third output peak amplitude range 732 from substantially zero to the first amplitude 714 and is of opposite phase to the first signal in the first output peak amplitude range. In effect, this means that the first signal 504 in the third range 732 is effectively a "negative" or 180-degrees phase shifted signal as compared to the first signal 504 in the first range 708. Also, in the third range 732, the second signal 512 is based on the signal to be amplified and has an amplitude that increases across the third output peak amplitude range 732 from the fourth amplitude 728 to a fifth amplitude 734. As a result, for example, in a particular implementation, the first amplifier may provide a RF-wise negative voltage at transistors of the BA, which may increase headroom for the voltages caused by their own output currents. Even with a very small first amplifier power of 1 W, for example, the balanced amplifier can keep ramping up so that the total amplifier circuit may in a particular example reach 16 W, well beyond the e.g. 9 W of the BA by itself.

It can be seen that the efficiency 706 of the amplifier circuit demonstrates an additional maximum at the upper end of the third range 732. In fact, in examples of this disclosure all the upper ends of all the amplitude ranges provide efficiency maxima. This may be because for example at these points the RF voltage swing is maximal at the outputs of the amplifiers that provide an RF output current. When the voltage swing is maximal, the average voltage over the transistors may instead be minimal during the time current pulses are injected. This may result in minimum loss and hence maximum efficiency. At the upper end of the first range 708 shown in FIG. 7 the first amplifier may in some examples fulfil this condition. At the upper end of the first auxiliary range 730 it is both the first amplifier and the BA, with voltage contributions in the same phase at the BA transistors in a particular example implementation. At the upper end of the second range 722 it is only the BA that is at maximum voltage swing, but also only the BA delivers current. At the upper end of the third range 732 both the first amplifier and the BA have full voltage swing and deliver current, but here the first amplifier voltage is in antiphase with the BA's voltage contribution at for example the transistors of the BA.

In some examples, the method 600 may further comprise operating the amplifier circuit in a first auxiliary output peak amplitude range 730 of the amplifier circuit 500, wherein the first auxiliary output peak amplitude range 730 is higher than the first output peak amplitude range 708 and lower than the second output peak amplitude range 722 and wherein, in the first auxiliary output peak amplitude range 730, the first signal 504 is based on the signal to be amplified and has the first amplitude 714 (i.e. is substantially constant across this range). Also, in this range 730, the second signal 512 is based on the signal to be amplified and has an amplitude that increases across the first auxiliary output peak amplitude range 730 from substantially zero to the third amplitude 726.

In some particular examples, a rate of increase of the second signal 512 across the second output peak amplitude range 722 from the third amplitude 726 to the fourth amplitude 728 may be higher than a rate of increase of the second signal 512 across the first auxiliary output peak amplitude range 730 from substantially zero to the third amplitude 726. Additionally or alternatively, a rate of increase of the second signal 512 across the third output peak amplitude range 732 from the fourth amplitude 728 to the fifth amplitude 734 is higher than a rate of increase of the second signal across the first auxiliary output peak amplitude range from substantially zero to the third amplitude 726. This can be seen in FIG. 7 as the current signal 716 has a steeper slope in the ranges 722 and 732 than in the range 730. This may be for example to compensate for the decreasing first signal 504 input to the first amplifier 502 (represented by current signal 712).

In some examples, the first amplifier may be sufficiently linear for small signals, since it operates alone at low output peak amplitudes of the amplifier circuit (e.g. in the first range 708) and also its output passes through zero between ranges 722 and 732. Thus in some examples the first amplifier may be implemented as a class B or AB amplifier (e.g. through choice of gate bias voltage). In some examples, the drive signal to the first amplifier (the first signal) may also need to provide a phase inversion between ranges 722 and 732. The BA has zero output at low amplitudes, such as for example in the first range 708, and so it may be biased in class C for higher efficiency.

In a variant example, a regular balanced amplifier may be used as the first amplifier. This may provide for example the benefit of low output reflection of traditional terminated BA operation.

Figure 8:
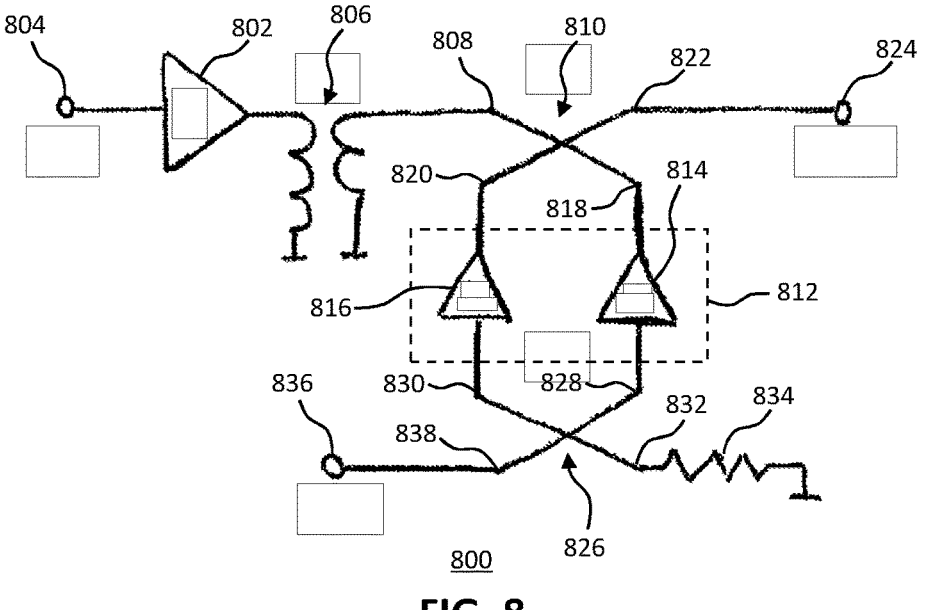
FIG. 8 is a circuit diagram of another example of an amplifier circuit 800 which may be operated in accordance with the method 600 of FIG. 6.

FIG. 8 is a circuit diagram of another example of an amplifier circuit 800 which may be operated in accordance with the method 600 of FIG. 6. The amplifier circuit 800 includes a first amplifier 802 (e.g. a control amplifier or load modulating amplifier) configured to receive a first signal 804. The output of the first amplifier 802 is connected via an impedance transformer 806 to a transmitted port 808 of a first directional coupler 810. The amplifier circuit 800 includes a balanced amplifier 812 comprising a second amplifier 814 and third amplifier 816. An output of the second amplifier 814 is connected to the input port 818 of the first directional coupler 810. An output of the third amplifier 816 is connected to an isolated port 820 of the first directional coupler 810, and a coupled port 822 of the first directional coupler 810 is connected to an output 824 of the amplifier circuit 500. The output 824 may provide for example an amplified signal.

The amplifier circuit 800 also comprises a second directional coupler 826. A transmitted port 828 of the second directional coupler 826 is connected to an input of the second amplifier 814, a coupled port 830 of the second directional coupler 826 is connected to an input of the third amplifier 816, and an isolated port 832 of the second directional coupler is terminated, for example via termination resistance 834. The method 800 may in some examples comprise providing the second signal 836 to an input port 838 of the second directional coupler. The second directional coupler 826 may for example provide the second signal 836 to the amplifiers 814 and 816 with a 90-degree phase difference between them (that is, with a 90-degree phase difference between the signals arriving at the inputs of the amplifiers 814 and 816).

In some examples, the first amplifier (e.g. first amplifier 802) and the balanced amplifier (e.g. balanced amplifier 812, comprising amplifiers 814 and 816) may be dimensioned accordingly. In one example, a parameter that is the square root of the ratio of maximum output power of the first amplifier, PCA, to maximum total output power, PTOT, of the amplifier circuit may be used, since this is independent of choice of voltage or transformation ratios. This dimensionless parameter, k, may for example determine the relative distance between efficiency maxima. For a choice of k less than $\frac{1}{3}$, there may be for example four efficiency maxima, found at relative output amplitudes k, 1−2k, 1−k, and 1. For k exactly $\frac{1}{3}$, the distance between the two lowest maxima is zero, so there may be three equally spaced efficiency maxima and no range wherein the first signal is substantially constant (e.g. as in the range 730 shown in FIG. 7). The power relations may in some examples be given by:

$$P_{TOT}=P_{CA}+P_{BA}$$

$$P_{CA}=k^{2*}P_{TOT}$$

$$P_{BA}=(1-k^2)^*P_{TOT}$$

In a particular example, $P_{TOT}=16$ W and k=$\frac{1}{4}$. The maximum output power of the first amplifier (e.g. the control amplifier) may then be $P_{CA}=1$ W, and hence the balanced amplifier's maximum output power may be $P_{BA}=15$ W. The second and third amplifiers 814 and 816 may thus each have 7.5 W maximum output power. With k=$\frac{1}{4}$, there may be four modes over four equally wide amplitude ranges, 0-0.25, 0.25-0.5, 0.5-0.75 and 0.75-1 of full amplitude. The top end of each range may constitute a maximum in the efficiency curve, i.e. the four efficiency maxima may be evenly distributed in amplitude at 0.25, 0.5, 0.75 and 1 of full peak output amplitude of the amplifier circuit.

A simple way to match the component amplifiers impedance-wise is for example by adjusting the output matching networks of the first amplifier and balanced amplifier individually. The first amplifier may in some examples be the simplest and may be matched to provide its maximum output (1 W) with good efficiency at the load, through the first directional coupler 810. Any impedance transformation should in some examples give maximal voltage swing at the transistor and may depend on the supply voltage ratio between the first amplifier and balanced amplifier. In an example, with a first amplifier power of $\frac{1}{16}$ of the total for the amplifier circuit, the load impedance at the first amplifier may be 4.5 times greater than at the individual transistors in the BA amplifiers (e.g. amplifiers 814 and 816) for equal supply voltages at both the first amplifier and BA transistors. If the BA amplifiers 814 and 816 and the first directional coupler 810 are matched to the same impedance, for example, then the impedance transformer 806 may provide exactly this amount of transformation.

When matching the BA individually, in some examples it should may be matched to its output power at efficiency at the third efficiency maximum at the top of the second range 722, where it operates by itself (as the first signal provided to the first amplifier is substantially zero). Since output power is proportional to amplitude squared, this means that in a particular example 9 W output power should be aimed for at the load, with high efficiency. This is given by the formula $P_{BA3}=P_{TOT}^*(1-k)^2$. Regarding the first amplifier, this may for example automatically give the necessary impedance transformation between the individual amplifiers and the first directional coupler, as well as mandating full voltage swing at the amplifier transistors.

In some examples, the method 600 may comprise generating the first and second signals based on the signal to be amplified. This may comprise generating the first signal based on the first signal scaled by a first factor, and generating the second signal based on the second signal scaled by a second factor. The first and second factors may in some examples take the same form as the signals 712 and 716 corresponding to the first and second signals respectively shown in FIG. 7. Thus, for example, the operating the amplifier circuit in the first output peak amplitude range 708 of the amplifier circuit may comprise, in the first output peak amplitude range 708, increasing the first factor across the first output peak amplitude range 708 from substantially zero to a first value, wherein the second factor is substantially zero. Similarly, for example, operating the amplifier circuit in the second output peak amplitude range 722 of the amplifier circuit may comprise, in the second output peak amplitude range 722, decreasing the first factor across the second output peak amplitude range 722 from the first value to a second value, and increasing the second factor across the second output peak amplitude range 722 from a third value to a fourth value.

In particular examples, an extra balanced amplifier stage maybe added. In other words, for example, the first amplifier (e.g. control amplifier) in the above amplifier circuits could itself be an amplifier circuit as described above. Therefore, for example, the first amplifier may be an amplifier circuit configured to operate according to the method 600 described above.

Figure 9:
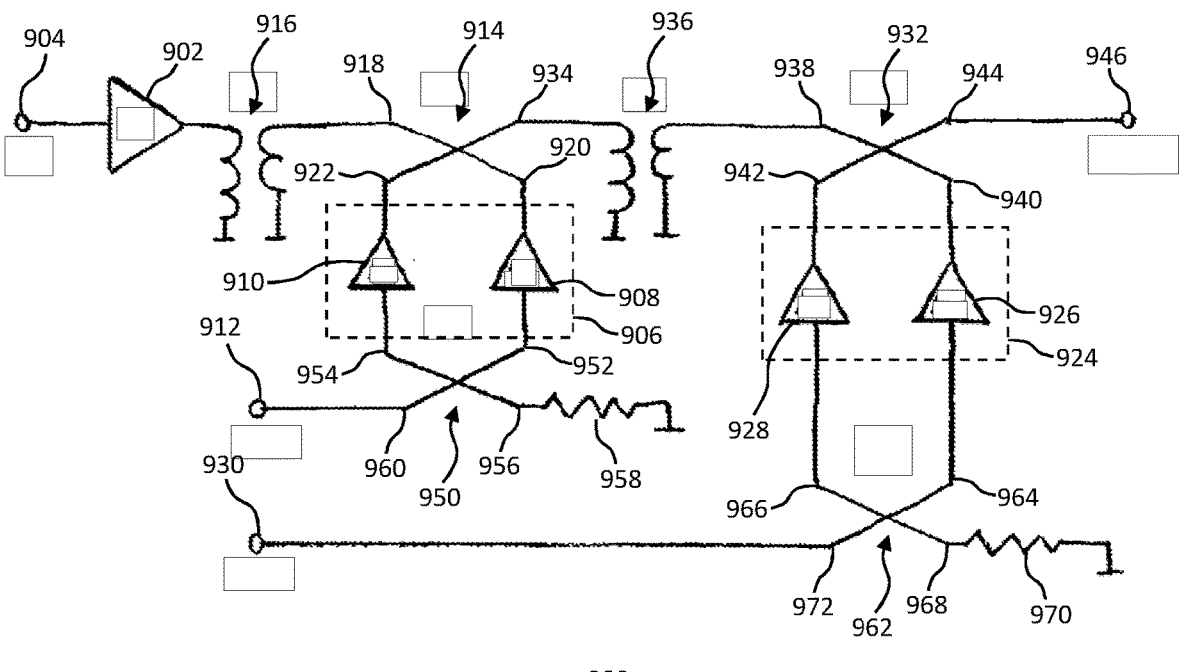
FIG. 9 is another example of an amplifier circuit.

FIG. 9 is an example of an amplifier circuit 900 of this configuration, which includes a first amplifier 902 configured to receive a first signal 904, and a first balanced amplifier 906 comprising second and third amplifiers 908 and 910 and configured to receive a second signal 912. The amplifier circuit 900 also includes a first directional coupler 914. An output of the first amplifier 902 is connected (in this example via a first impedance transformer 916) to a transmitted port 918 of the first directional coupler 914. An output of the second amplifier 908 is connected to an input port 920 of the first directional coupler 914, and an output of the third amplifier 910 is connected to an isolated port 922 of the first directional coupler. These components may in some examples correspond to the amplifier circuit 100, 200, 500 or 800 described above.

The amplifier circuit 900 also includes a second balanced amplifier 924 comprising fourth and fifth amplifiers 926 and 928 and configured to receive a third signal 930. A second directional coupler 932 is present, wherein a coupled port 934 of the first directional coupler 914 is connected (in this example via a second impedance transformer 936) to a transmitted port 938 of the second directional coupler 932. An output of the fourth amplifier 926 is connected to an input port 940 of the second directional coupler 932. An output of the fifth amplifier 928 is connected to an isolated port 942 of the second directional coupler 932, and a coupled port 944 of the second directional coupler 932 is connected to an output 946 of the amplifier circuit 900.

FIG. 10 is a flow chart of an example of a method 1000 of operating an amplifier circuit, such as for example the amplifier circuit 900 of FIG. 9 or any amplifier disclosed herein with a further stage (e.g. a control amplifier and at least two balanced amplifiers). The method 1000 comprises, in step 1002, operating the amplifier circuit 900 in a first output peak amplitude range of the amplifier circuit 900 wherein, in the first output peak amplitude range, the first signal 904 is based on a signal to be amplified and has an amplitude that increases across the first output peak amplitude range from substantially zero to a first amplitude, the second signal 912 is substantially zero, and the third signal 930 is substantially zero.

Figure 11:
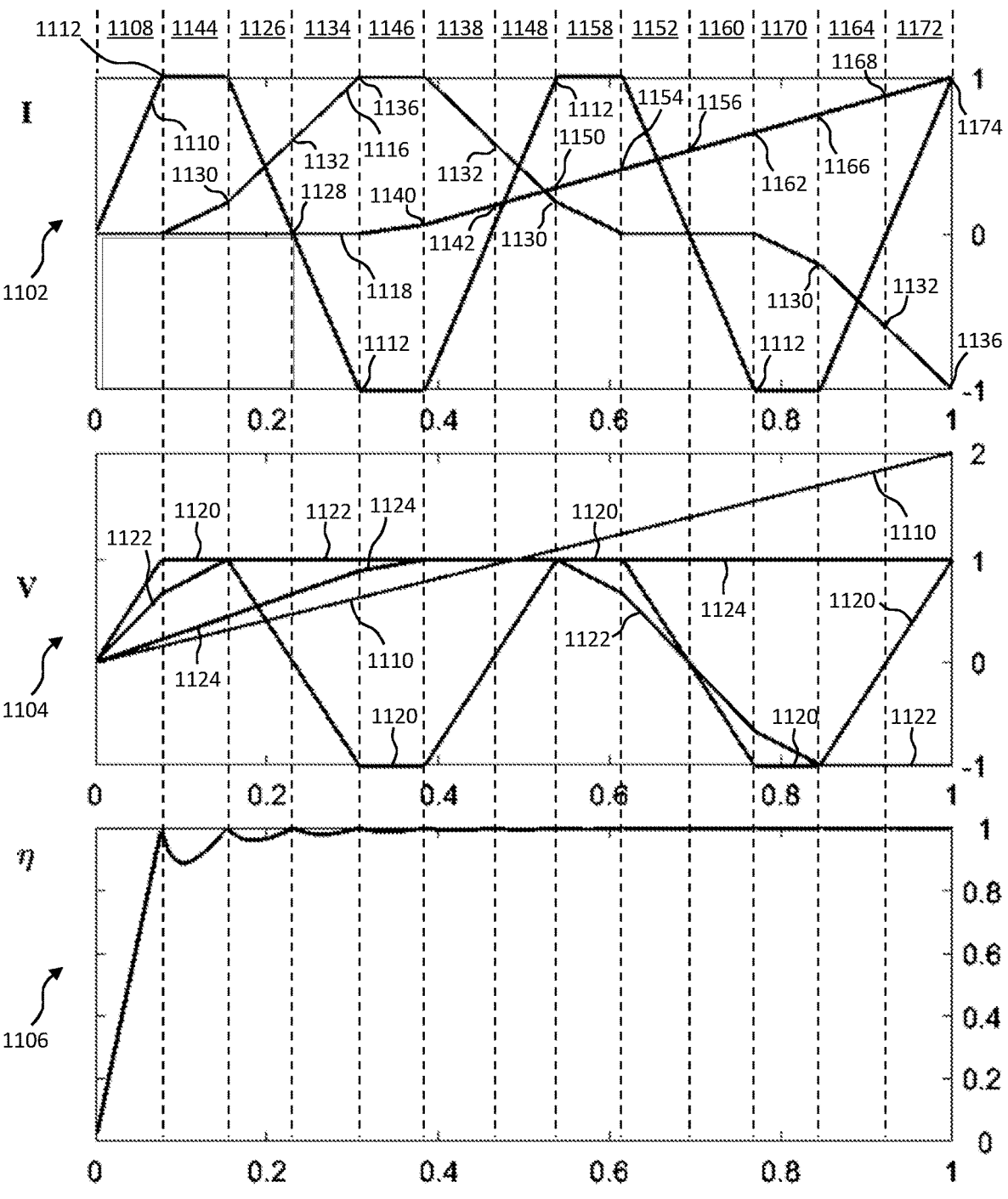
FIG. 11 is a graph showing an example of signals in the amplifier circuit during operation in accordance with the method of FIG. 10.

FIG. 11 is a graph showing an example of signals in the amplifier circuit during operation in accordance with the method 1000. In particular, the signals and graphs shown include currents 1102, voltages 1104 and efficiency 1106 in the amplifier circuit. In the first output peak amplitude range 1108 (as shown by amplifier circuit output voltage 1110), the first signal 904 (as shown by current signal 1112) has an amplitude that increases across the first output peak amplitude range from substantially zero to a first amplitude 1114. The first signal 1112 is also based on an amplifier input signal. That is, for example, the amplifier input signal is a signal to be amplified and be provided as the amplified output signal 946, and the first signal 1112 may be an amplified, scaled or otherwise manipulated version of the amplifier input signal. In some examples, the amplifier input signal may be produced from a digital signal, e.g. may be provided from a digital to analogue converter (DAC). In the first output peak amplitude range 1108, the second signal 912 (as shown by current signal 1116) is substantially zero, and the third signal 930 (as shown by current signal 1118) is substantially zero. Voltage output from the first amplifier 902, which in some examples may be a control amplifier or load modulating amplifier, is shown as voltage signal 1120, and voltage output from the first balanced amplifier 906 is shown as voltage signal 1122. Voltage output from the second balanced amplifier 924 is shown as voltage signal 1124.

Referring back to FIG. 10, the method 1000 comprises, in step 1004, operating the amplifier circuit in a second output peak amplitude range 1126 of the amplifier circuit, wherein the second output peak amplitude range 1126 is higher than the first output peak amplitude range 1108. In the second output peak amplitude range 1126, the first signal 904 is based on the signal to be amplified and has an amplitude that decreases across the second output peak amplitude range 1126 from the first amplitude 1112 to a second amplitude 1128 (which in this example is zero). The second signal 912 is based on the signal to be amplified and has an amplitude that increases across the second output peak amplitude range from a third amplitude 1130 to a fourth amplitude 1132. The third signal 930 is substantially zero in this range.

The method 1000 also comprises, in step 1006, operating the amplifier circuit in a third output peak amplitude range 1134 of the amplifier circuit. The third output peak amplitude range 1134 is higher than the second output peak amplitude range 1126. In the third output peak amplitude range 1134, the first signal 904 is based on the signal to be amplified and has an amplitude that increases across the third output peak amplitude range 1134 from substantially zero to the first amplitude 1112 and is of opposite phase to the first signal in the first output peak amplitude range. That is, for example, the first signal 904 in the third range 1134 is effectively in antiphase to the first signal 904 in the first range 1108. The second signal 912 is based on the signal to be amplified and has an amplitude that increases across the third output peak amplitude range 1134 from the fourth amplitude 1132 to a fifth amplitude 1136, and the third signal 930 is substantially zero.

The method 1000 also comprises, in step 1008, operating the amplifier circuit in a fourth output peak amplitude range 1138 of the amplifier circuit, wherein the fourth output peak amplitude range 1138 is higher than the third output peak amplitude range 1134. In the fourth output peak amplitude range 1138, the first signal 904 is based on the signal to be amplified and has an amplitude that decreases across the fourth output peak amplitude range 1138 from the first amplitude 1112 to substantially zero and is of opposite phase to the first signal in the first output peak amplitude range. The second signal 912 is based on the signal to be amplified and has an amplitude that decreases across the fourth output peak amplitude range 1138 from the fifth amplitude 1136 to the fourth amplitude 1132, and the third signal 930 has an amplitude that increases across the fourth output peak amplitude range 1138 from a sixth amplitude 1140 to a seventh amplitude 1142.

In some examples, the method 1000 further comprises operating the amplifier circuit in a first auxiliary output peak amplitude range 1144 of the amplifier circuit. The first auxiliary output peak amplitude range 1144 is higher than the first output peak amplitude range 1108 and lower than the second output peak amplitude range 1126. In the first auxiliary output peak amplitude range 1144, the first signal 904 is based on the signal to be amplified and has the first amplitude 1112 (i.e. is substantially constant across this range). The second signal 912 is based on the signal to be amplified and has an amplitude that increases across the first auxiliary output peak amplitude range 1144 from substantially zero to the third amplitude 1130, and the third signal 930 is substantially zero. In some examples, the rate of increase of the second signal 912 across the second output peak amplitude range 1126 from the third amplitude 1130 to the fourth amplitude 1132 is higher than a rate of increase of the second signal 912 across the first auxiliary output peak amplitude range 1144 from substantially zero to the third amplitude 1130. Additionally or alternatively, the rate of increase of the second signal 912 across the third output peak amplitude range 1134 from the fourth amplitude 1132 to the fifth amplitude 1136 is higher than a rate of increase of the second signal 912 across the first auxiliary output peak amplitude range 1144 from substantially zero to the third amplitude 1130. This may be for example to compensate for the decrease in the first signal 904 in the range 1126 and/or 1134.

In some examples, the first auxiliary output peak amplitude range is not present. In these cases, the third amplitude 1130 may be substantially zero.

In some examples, the method 1000 further comprises operating the amplifier circuit in a third auxiliary output peak amplitude range 1146 of the amplifier circuit. The third auxiliary output peak amplitude range 1146 is higher than the third output peak amplitude range 1134 and lower than the fourth output peak amplitude range 1138. In the third auxiliary output peak amplitude range 1146, the first signal 904 is based on the signal to be amplified and has the first amplitude 1112 (i.e. its amplitude is substantially constant over the range) and is of opposite phase to the first signal in the first output peak amplitude range 1108. The second signal is based on the signal to be amplified and has the fifth amplitude 1136 (i.e. its amplitude is substantially constant), and the third signal 930 is based on the signal to be amplified and has an amplitude that increases across the third auxiliary output peak amplitude range 1146 from substantially zero to the sixth amplitude 1140. In some particular examples, a rate of increase of the third signal 930 across the fourth output peak amplitude range 1138 is higher than a rate of increase of the third signal 930 across the third auxiliary output peak amplitude range 1146, for example to compensate for the decreasing second signal 912 and/or the decreasing (in amplitude) first signal 904.

In some examples, the method 1000 comprises operating the amplifier circuit in a fifth output peak amplitude range 1148 of the amplifier circuit, wherein the fifth output peak amplitude range 1148 is higher than the fourth output peak amplitude range 1138. In the fifth output peak amplitude range 1148, the first signal 904 is based on the signal to be amplified and has an amplitude that increases across the fifth output peak amplitude range 1148 from substantially zero to the first amplitude 1112. The second signal 912 is based on the signal to be amplified and has an amplitude that decreases across the fifth output peak amplitude range 1148 from the fourth amplitude 1132 to the third amplitude 1130, and the third signal 930 is based on the signal to be amplified and has an amplitude that increases across the fifth output peak amplitude range 1148 from the seventh amplitude 1142 to an eighth amplitude 1150.

In some examples, the method 1000 comprises operating the amplifier circuit in a sixth output peak amplitude range 1152 of the amplifier circuit, wherein the sixth output peak amplitude range 1152 is higher than the fifth output peak amplitude range 1148. In the sixth output peak amplitude range 1152, the first signal 904 is based on the signal to be amplified and has an amplitude that decreases across the sixth output peak amplitude range 1152 from the first amplitude 1112 to substantially zero. The second signal 912 is substantially zero, and the third signal 930 is based on the signal to be amplified and has an amplitude that increases across the sixth output peak amplitude range 1152 from a ninth amplitude 1154 to a tenth amplitude 1156. In particular examples, the method 1000 may comprise operating the amplifier circuit in a fifth auxiliary output peak amplitude range 1158 of the amplifier circuit. The fifth auxiliary output peak amplitude range 1158 is higher than the fifth output peak amplitude range 1148 and lower than the sixth output peak amplitude range 1152. In the fifth auxiliary output peak amplitude range 1158, the first signal 904 is based on the signal to be amplified and has the first amplitude 1112. The second signal 912 is based on the signal to be amplified and has an amplitude that decreases across the fifth auxiliary output peak amplitude range 1158 from the third amplitude 1130 to substantially zero, and the third signal 930 is based on the signal to be amplified and has an amplitude that increases across the fifth auxiliary output peak amplitude range 1158 from the eighth amplitude 1150 to the ninth amplitude 1154. However, in some examples where the fifth auxiliary output peak amplitude range 1158 is not present, the eighth amplitude 1150 may be substantially equal to the ninth amplitude 1154.

In some examples, the method 1000 further comprises operating the amplifier circuit in a seventh output peak amplitude range 1160 of the amplifier circuit. The seventh output peak amplitude range 1160 is higher than the sixth output peak amplitude range 1152. In the seventh output peak amplitude range 1160, the first signal 904 is based on the signal to be amplified and has an amplitude that increases across the seventh output peak amplitude range 1160 from substantially zero to the first amplitude 1112 and is of opposite phase to the first signal in the first output peak amplitude range 1108. The second signal 912 is substantially zero, and the third signal 930 is based on the signal to be amplified and has an amplitude that increases across the seventh output peak amplitude range 1160 from the tenth amplitude 1156 to an eleventh amplitude 1162. In particular examples, the method 1000 may further comprise operating the amplifier circuit in an eighth output peak amplitude range 1164 of the amplifier circuit, wherein the eighth output peak amplitude range 1164 is higher than the seventh output peak amplitude range 1160. In the eighth output peak amplitude range 1164, the first signal 904 is based on the signal to be amplified and has an amplitude that decreases across the eighth output peak amplitude range 1164 from the first amplitude 1112 to substantially zero and is of opposite phase to the first signal in the first output peak amplitude range 1108. The second signal 912 is based on the signal to be amplified and has an amplitude that increases across the eighth output peak amplitude range 1164 from the third amplitude 1130 to the fourth amplitude 1132 and is of opposite phase to the second signal in the second output peak amplitude range 1126, and the third signal 930 is based on the signal to be amplified and has an amplitude that increases across the eighth output peak amplitude range 1164 from a twelfth amplitude 1166 to a thirteenth amplitude 1168. In particular examples, the method 1000 may comprise operating the amplifier circuit in a seventh auxiliary output peak amplitude range 1170 of the amplifier circuit. The seventh auxiliary output peak amplitude range 1170 is higher than the seventh output peak amplitude range 1160 and lower than the eighth output peak amplitude range 1164. In the seventh auxiliary output peak amplitude range 1170, the first signal 904 is based on the signal to be amplified and has the first amplitude 1112 and is of opposite phase to the first signal in the first output peak amplitude range. The second signal 912 is based on the signal to be amplified and has an amplitude that increases across the eighth output peak amplitude range 1170 from substantially zero to the third amplitude 1130 and is of opposite phase to the second signal in the second output peak amplitude range 1126, and the third signal 930 is based on the signal to be amplified and has an amplitude that increases across the eighth output peak amplitude range 1170 from the eleventh amplitude 1162 to the twelfth amplitude 1166. However, in examples where the seventh auxiliary output peak amplitude range 1170 is not present, the eleventh amplitude 1162 may be substantially equal to the twelfth amplitude 1166.

In some examples, the method 1000 may comprise operating the amplifier circuit in an additional output peak amplitude range 1172 of the amplifier circuit. The additional output peak amplitude range 1172 is higher than the eighth output peak amplitude range 1164. In the additional output peak amplitude range 1172, the first signal 904 is based on the signal to be amplified and has an amplitude that increases from substantially zero to the first amplitude 1112 across the range. The second signal 912 is based on the signal to be amplified and has an amplitude that increases across the range 1172 from the fourth amplitude 1132 to the fifth amplitude 1136 and is of opposite phase to the second signal in the second output peak amplitude range 1126, and the third signal 930 is based on the signal to be amplified and has an amplitude that increases across the additional output peak amplitude range 1172 from the thirteenth amplitude 1168 to a fourteenth amplitude 1174.

It can be seen from the (normalized) efficiency curve 1106 that there is an efficiency maximum at the upper end of each of the ranges shown in FIG. 11. Thus, for example, there may be up to thirteen efficiency maxima depending on the number of ranges used in a particular example implementation of the operation of the amplifier circuit (such as for example the amplifier circuit 900).

Referring back to FIG. 9, in some examples the amplifier circuit comprises a third directional coupler 950. A transmitted port 952 of the third directional coupler 950 is connected to an input of the second amplifier 908. A coupled port 954 of the third directional coupler 950 is connected to an input of the third amplifier 910, and an isolated port 956 of the third directional coupler 950 is terminated, for example via termination resistance 958. In some examples, the method 1000 comprises providing the second signal 912 to an input port 960 of the third directional coupler 950.

In some examples, the amplifier circuit 900 comprises a fourth directional coupler 962. A transmitted port 964 of the fourth directional coupler 962 is connected to an input of the fourth amplifier 926. A coupled port 966 of the fourth directional coupler 962 is connected to an input of the fifth amplifier 928, and an isolated port 968 of the fourth directional coupler 962 is terminated, for example via termination resistance 970. In some examples, the method 1000 comprises providing the third signal 930 to an input port 972 of the fourth directional coupler 962.

The method 1000 may in some examples comprise generating the first, second and third signals based on the signal to be amplified. For example, these may be generated from digital signals (e.g. outputs from respective DACs).

In a particular example implementation of the amplifier circuit 900, the first amplifier has 16 W output ($PCA*4^2$) and thus the amplifier circuit 900 will have 169 W output, i.e. $PCA*13^2$. The defining parameter, k2, for the second balanced amplifier's dimensioning in relation to the first amplifier and first balanced amplifier is the square root of $^{16}/_{169}$, i.e. $^4/_{13}$. The output power of the second BA may be for example 169 W–16 W=153 W, split in two amplifiers 926 and 928 with 76.5 W each. When matching the second BA individually, it may for example be matched at its output power at the upper end of range 1152, where it operates by itself as the signals 1110 and 1118 are substantially zero. This means for example match for $(^9/_{13})^2*P_{TOT}=81$ W output power at the load with high efficiency. The impedance level at the individual amplifiers 926 and 928 of the second AB 924 may be for example $^1/_9$ of the impedance at the amplifiers 908 and 910 of the first BA 906, if there are equal supply voltages throughout. The relative impedance levels may thus be for example 40.5 to 9 to 1 for the first amplifier, first B and second BA respectively. The large impedance ratio of 40.5:1 comes from the 9 times impedance ratio from the first BA to the second BA times the factor 4.5 from the first amplifier to the first BA. If for example a balanced amplifier is instead used for the first amplifier, the relative impedance levels may become 81 to 9 to 1. These large impedance ratios may be difficult to achieve in practice, so instead a lower supply voltage and a lower voltage transistor technology could be used in some examples for the smallest amplifier. For example, a voltage swing reduction by a factor of 3, by using a 10 V supply voltage instead of 30 V, lets us reduce the impedance level by a factor of 9.

In these examples, such as for example the amplifier circuit 900 shown in FIG. 9, the first amplifier may be sufficiently linear for small signals, which may call for operation in class B or AB, as both BAs have substantially zero output at low amplitudes: the first BA in range 1108, and the second BA in ranges 1108, 1144, 1126 and 1134. The first BA also has substantially zero output in ranges 1152 and 1160. Both Bas can therefore in some examples be biased in class C for higher efficiency.

Figure 12:
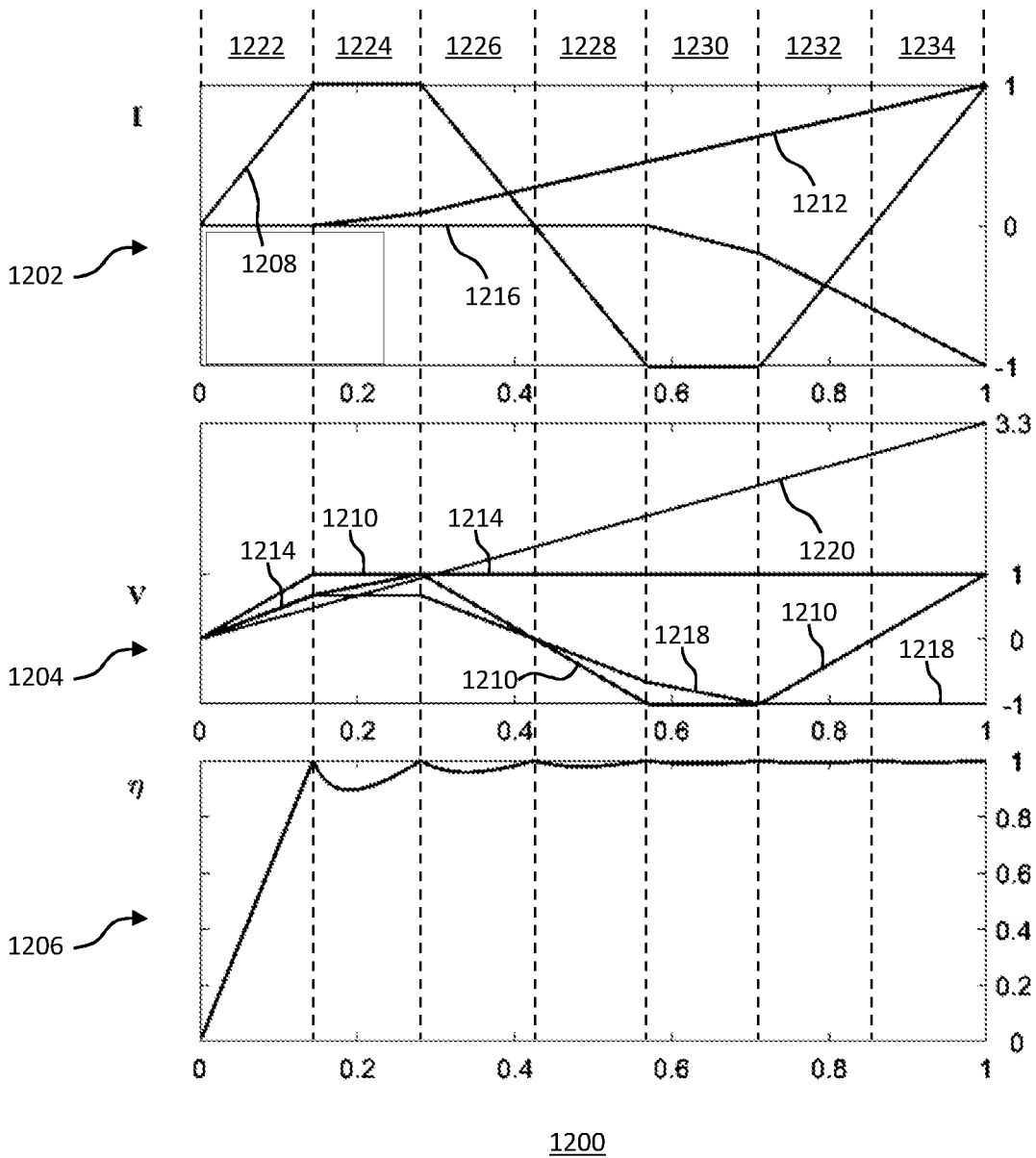
FIG. 12 is a graph showing an example of signals in the amplifier circuit during operation in accordance with another example method.

FIG. 12 is a graph showing an example of signals in the amplifier circuit, such as for example the amplifier circuit 900 shown in FIG. 9, during operation in accordance with another example method. In particular, the signals and graphs shown include currents 1202, voltages 1204 and efficiency 1206 in the amplifier circuit. The graphs include a first signal 904 (illustrated as current signal 1208), and corresponding output voltage 1210 of the first amplifier 902; a third signal 930 (illustrated as current signal 1212), and corresponding output voltage 1214 of the second balanced amplifier 924; and a second signal 912 (illustrated as current signal 1216), and corresponding output voltage 1218 of the first balanced amplifier 906. Overall output voltage of the amplifier circuit is shown as signal 1220. The amplifier circuit operates in increasing output peak amplitude ranges 1222, 1224, 1226, 1228, 1230, 1232 and 1234. The first current signal 1208 increases in the first range 1222, remains substantially constant in the second range 1224, decreases in the third range 1226, increases and is in antiphase in fourth range 1228, remains substantially constant and in antiphase in fifth range 1230, decreases and is in antiphase in sixth range 1232 and increases and is in-phase in seventh range 1234. The second current signal 1212 remains substantially at zero in the first range 1222, increases in the second range 1224, and increases at a faster pace in ranges 1226, 1228, 1230, 1232 and 1234 compared to range 1224. The third signal remains substantially at zero in ranges 1222, 1224, 1226 and 1228, increases and is in antiphase in range 1230, and increases (in antiphase) at a faster pace in ranges 1232 and 1234 compared to range 1230. This may represent a simpler implementation than that shown in FIG. 11, and hence may in some examples have fewer or simpler implementation components. A further simplification can be made for example by omitting the second range 1224 and/or the fifth range 1230.

This example may achieve advantages such as for example lower complexity and low impedance ratios compared to the examples shown in FIG. 11. The complexity reduction may be achieved at least in part by having phase reversals (i.e. both in-phase and antiphase parts) only for the signal provided from the first amplifier (e.g. control amplifier or load modulating amplifier). This means that the balanced amplifiers can instead be driven more easily, for example with the same linear input signal and different class C biases.

In a particular implementation, which is operated in accordance with the signals shown in FIG. 12, an amplifier circuit such as that shown in FIG. 9 may have 4.5 times higher impedance level at the first amplifier than at the balanced amplifiers. This amplifier may have up to seven efficiency maxima as shown by the graph 1206 in FIG. 12. The total output power is 49 times the power of the first amplifier, with the first and second balanced amplifiers having 15 and 33 times the first amplifier power respectively.

It is noted that the relative and absolute amplitudes shown in the graphs of FIGS. 7, 11 and 12 are merely illustrative examples and that the amplitudes may be different in other implementations and/or may vary between different signals (e.g. between the first and second signals). It is also noted that the amplifier circuits described herein may be for example LMBAs (load modulated balanced amplifiers). Each of the directional couplers described herein in the amplifier circuits may comprise for example a 90-degree hybrid coupler.

Some examples may employ differently shaped drive signals to the different amplifier stages (first amplifier, balanced amplifiers etc). That is, for example, the input signal (the signal to be amplified by the amplifier circuit) may be applied at different amplitudes or signal levels to the different amplifiers, and also in some cases in antiphase. This can for example be achieved by digital processing. In some example implementations, each different signal provided to each amplifier may require an associated DAC. If the number of digitally controlled drive signals is limited, analog circuitry could instead be used in some examples for shaping the output currents. As a method for analog shaping of the amplifier signals, in one or more of the BA stages, class C biasing, i.e. more negative DC bias, can be used. This shaping can then be done for example directly in one or more transistors in the amplifiers with a linear drive signal applied, and may also provide higher DC to RF current conversion efficiency than class B or class AB biasing. Pre-shaping by class C biasing of amplifier transistors may also be used, together with a less negative bias in one or more of the transistors.

The analog shaping of the drive signal to the first amplifier (e.g. control amplifier) in a four-range amplifier circuit, for example as illustrated by FIG. 7, can be done by using a class C biased amplifier for the first amplifier, driven by the linear input signal, added in antiphase with the linear input signal itself. In this way the negative amplitude slope in ranges 722 and 732 may be achieved by a class C biased amplifier with bias set so that it starts delivering output current at the lower end of range 722. The flat amplitude of range 730 can be achieved by another such class C amplifier with a breakpoint at the lower end of range 730. Another option may be for example to use the natural compression/saturation of a transistor in the first amplifier, which may be at full output amplitude in range 730, since this requires no extra class C amplifiers.

The addition of the class C signal to the linear signal can be done in some examples by injection of the output current of the class C biased transistor directly into the drive signal path, if it is properly backward terminated or has a buffer stage. Methods that don't rely on these conditions may use directional coupler- or power combiner-based signal addition instead. One such method is for example to use two class C biased transistors coupled via a 90-degree 3-dB hybrid in a similar manner as a BA stage in an amplifier circuit as described herein.

It should be noted that the above-mentioned examples illustrate rather than limit the invention, and that those skilled in the art will be able to design many alternative examples without departing from the scope of the appended statements. The word "comprising" does not exclude the presence of elements or steps other than those listed in a claim, "a" or "an" does not exclude a plurality, and a single processor or other unit may fulfil the functions of several units recited in the statements below. Where the terms, "first", "second" etc. are used they are to be understood merely as labels for the convenient identification of a particular feature. In particular, they are not to be interpreted as describing the first or the second feature of a plurality of such features (i.e. the first or second of such features to occur in time or space) unless explicitly stated otherwise. Steps in the methods disclosed herein may be carried out in any order unless expressly otherwise stated. Any reference signs in the statements shall not be construed so as to limit their scope.

REFERENCES

The following references are incorporated herein by reference:
[1] Shepphard et al., "An Efficient Broadband Reconfigurable Power Amplifier Using Active Load Modulation," IEEE Microwave and Wireless Components Letters, vol. 26, no. 6, June 2016
[2] Pednekar et al., "Analysis and Design of a Doherty-Like RF-Input Load Modulated Balanced Amplifier," IEEE TRANSACTIONS ON MICROWAVE THEORY AND TECHNIQUES, VOL. 66, NO. 12, DECEMBER 2018, pp. 5322-5335

The invention claimed is:

1. A method of operating an amplifier circuit, wherein the amplifier circuit comprises:

a first amplifier configured to receive a first signal;

a balanced amplifier comprising second and third amplifiers and configured to receive a second signal; and a first directional coupler; and wherein an output of the first amplifier is connected to a transmitted port of the first directional coupler, an output of the second amplifier is connected to an input port of the first directional coupler, an output of the third amplifier is connected to an isolated port of the first directional coupler, and a coupled port of the first directional coupler is connected to an output of the amplifier circuit;

the method comprising:

operating the amplifier circuit in a first output peak amplitude range of the amplifier circuit wherein, in the first output peak amplitude range, the first signal is based on a signal to be amplified and has an amplitude that increases across the first output peak amplitude range from substantially zero to a first amplitude, and the second signal is substantially zero; and operating the amplifier circuit in a second output peak amplitude range of the amplifier circuit, wherein the second output peak amplitude range is higher than the first output peak amplitude range and wherein, in the second output peak amplitude range, the first signal is based on the signal to be amplified and has an amplitude that decreases across the second output peak amplitude range from the first amplitude to a second amplitude, and the second signal is based on the signal to be amplified and has an amplitude that increases across the second output peak amplitude range from a third amplitude to a fourth amplitude.

2. A method of operating an amplifier circuit, wherein the amplifier circuit comprises:

a first amplifier configured to receive a first signal;

a first balanced amplifier comprising second and third amplifiers and configured to receive a second signal;

a first directional coupler, wherein an output of the first amplifier is connected to a transmitted port of the first directional coupler, an output of the second amplifier is connected to an input port of the first directional coupler, and an output of the third amplifier is connected to an isolated port of the first directional coupler;

a second balanced amplifier comprising fourth and fifth amplifiers and configured to receive a third signal; and a second directional coupler, wherein a coupled port of the first directional coupler is connected to a transmitted port of the second directional coupler, an output of the fourth amplifier is connected to an input port of the second directional coupler, an output of the fifth amplifier is connected to an isolated port of the second directional coupler, and a coupled port of the second directional coupler is connected to an output of the amplifier circuit; and the method comprising:

operating the amplifier circuit in a first output peak amplitude range of the amplifier circuit wherein, in the first output peak amplitude range, the first signal is based on a signal to be amplified and has an amplitude that increases across the first output peak amplitude range from substantially zero to a first amplitude, the second signal is substantially zero, and the third signal is substantially zero;

operating the amplifier circuit in a second output peak amplitude range of the amplifier circuit, wherein the second output peak amplitude range is higher than the first output peak amplitude range and wherein, in the second output peak amplitude range, the first signal is based on the signal to be amplified and has an amplitude that decreases across the second output peak amplitude range from the first amplitude to a second amplitude, the second signal is based on the signal to be amplified and has an amplitude that increases across the second output peak amplitude range from a third amplitude to a fourth amplitude, and the third signal is substantially zero;

operating the amplifier circuit in a third output peak amplitude range of the amplifier circuit, wherein the third output peak amplitude range is higher than the second output peak amplitude range and wherein, in the third output peak amplitude range, the first signal is based on the signal to be amplified and has an amplitude that increases across the third output peak amplitude range from substantially zero to the first amplitude and is of opposite phase to the first signal in the first output peak amplitude range, the second signal is based on the signal to be amplified and has an amplitude that increases across the third output peak amplitude range from the fourth amplitude to a fifth amplitude, and the third signal is substantially zero; and operating the amplifier circuit in a fourth output peak amplitude range of the amplifier circuit, wherein the fourth output peak amplitude range is higher than the third output peak amplitude range and wherein, in the fourth output peak amplitude range, the first signal is based on the signal to be amplified and has an amplitude that decreases across the fourth output peak amplitude range from the first amplitude to substantially zero and is of opposite phase to the first signal in the first output peak amplitude range, the second signal is based on the signal to be amplified and has an amplitude that decreases across the fourth output peak amplitude range from the fifth amplitude to the fourth amplitude, and the and the third signal has an amplitude that increases across the fourth output peak amplitude range from a sixth amplitude to a seventh amplitude.

3. The method of claim 2, further comprising operating the amplifier circuit in a first auxiliary output peak amplitude range of the amplifier circuit, wherein the first auxiliary output peak amplitude range is higher than the first output peak amplitude range and lower than the second output peak amplitude range and wherein, in the first auxiliary output peak amplitude range, the first signal is based on the signal to be amplified and has the first amplitude, the second signal is based on the signal to be amplified and has an amplitude that increases across the first auxiliary output peak amplitude range from substantially zero to the third amplitude, and the third signal is substantially zero.

4. The method of claim 3, wherein a rate of increase of the second signal across the second output peak amplitude range from the third amplitude to the fourth amplitude is higher than a rate of increase of the second signal across the first auxiliary output peak amplitude range from substantially zero to the third amplitude, and/or a rate of increase of the second signal across the third output peak amplitude range from the fourth amplitude to the fifth amplitude is higher than a rate of increase of the second signal across the first auxiliary output peak amplitude range from substantially zero to the third amplitude.

5. The method of claim 2, wherein the third amplitude is substantially zero.

6. The method of any of claim 2, further comprising operating the amplifier circuit in a third auxiliary output peak amplitude range of the amplifier circuit, wherein the third auxiliary output peak amplitude range is higher than the third output peak amplitude range and lower than the fourth output peak amplitude range and wherein, in the third auxiliary output peak amplitude range, the first signal is based on the signal to be amplified and has the first amplitude and is of opposite phase to the first signal in the first output peak amplitude range, the second signal is based on the signal to be amplified and has the fifth amplitude, and the third signal is based on the signal to be amplified and has an amplitude that increases across the third auxiliary output peak amplitude range from substantially zero to the sixth amplitude.

7. The method of claim 6, wherein a rate of increase of the third signal across the fourth output peak amplitude range from the sixth amplitude to the seventh amplitude is higher than a rate of increase of the third signal across the third auxiliary output peak amplitude range from substantially zero to the sixth amplitude.

8. The method of any of claim 2, further comprising operating the amplifier circuit in a fifth output peak amplitude range of the amplifier circuit, wherein the fifth output peak amplitude range is higher than the fourth output peak amplitude range and wherein, in the fifth output peak amplitude range, the first signal is based on the signal to be amplified and has an amplitude that increases across the fifth output peak amplitude range from substantially zero to the first amplitude, the second signal is based on the signal to be amplified and has an amplitude that decreases across the fifth output peak amplitude range from the fourth amplitude to the third amplitude, and the third signal is based on the signal to be amplified and has an amplitude that increases across the fifth output peak amplitude range from the seventh amplitude to an eighth amplitude.

9. The method of any of claim 2, further comprising operating the amplifier circuit in an sixth output peak amplitude range of the amplifier circuit, wherein the sixth output peak amplitude range is higher than the fifth output peak amplitude range and wherein, in the sixth output peak amplitude range, the first signal is based on the signal to be amplified and has an amplitude that decreases across the sixth output peak amplitude range from the first amplitude to substantially zero, the second signal is substantially zero, and the third signal is based on the signal to be amplified and has an amplitude that increases across the sixth output peak amplitude range from a ninth amplitude to a tenth amplitude.

10. The method of claim 8, wherein the eighth amplitude is substantially equal to the ninth amplitude.

11. The method of claim 8, further comprising operating the amplifier circuit in a fifth auxiliary output peak amplitude range of the amplifier circuit, wherein the fifth auxiliary output peak amplitude range is higher than the fifth output peak amplitude range and lower than the sixth output peak amplitude range and wherein, in the fifth auxiliary output peak amplitude range, the first signal is based on the signal to be amplified and has the first amplitude, the second signal is based on the signal to be amplified and has an amplitude that decreases across the fifth auxiliary output peak amplitude range from the third amplitude to substantially zero, and the third signal is based on the signal to be amplified and has an amplitude that increases across the fifth auxiliary output peak amplitude range from the eighth amplitude to the ninth amplitude.

12. The method of any of claim 9, further comprising operating the amplifier circuit in a seventh output peak amplitude range of the amplifier circuit, wherein the seventh output peak amplitude range is higher than the sixth output peak amplitude range and wherein, in the seventh output peak amplitude range, the first signal is based on the signal to be amplified and has an amplitude that increases across the seventh output peak amplitude range from substantially zero to the first amplitude and is of opposite phase to the first signal in the first output peak amplitude range, the second signal is substantially zero, and the third signal is based on the signal to be amplified and has an amplitude that increases across the seventh output peak amplitude range from the tenth amplitude to an eleventh amplitude.

13. The method of claim 12, further comprising operating the amplifier circuit in an eighth output peak amplitude range of the amplifier circuit, wherein the eighth output peak amplitude range is higher than the seventh output peak amplitude range and wherein, in the eighth output peak amplitude range, the first signal is based on the signal to be amplified and has an amplitude that decreases across the eighth output peak amplitude range from the first amplitude to substantially zero and is of opposite phase to the first signal in the first output peak amplitude range, the second signal is based on the signal to be amplified and has an amplitude that increases across the eighth output peak amplitude range from the third amplitude to the fourth amplitude and is of opposite phase to the second signal in the second output peak amplitude range, and the third signal is based on the signal to be amplified and has an amplitude that increases across the eighth output peak amplitude range from a twelfth amplitude to a thirteenth amplitude.

14. The method of claim 13, wherein the eleventh amplitude is substantially equal to the twelfth amplitude.

15. The method of claim 13, further comprising operating the amplifier circuit in a seventh auxiliary output peak amplitude range of the amplifier circuit, wherein the seventh auxiliary output peak amplitude range is higher than the seventh output peak amplitude range and lower than the eighth output peak amplitude range and wherein, in the seventh auxiliary output peak amplitude range, the first signal is based on the signal to be amplified and has the first amplitude and is of opposite phase to the first signal in the first output peak amplitude range, the second signal is based on the signal to be amplified and has an amplitude that increases across the eighth output peak amplitude range from substantially zero to the third amplitude and is of opposite phase to the second signal in the second output peak amplitude range, and the third signal is based on the signal to be amplified and has an amplitude that increases across the eighth output peak amplitude range from the eleventh amplitude to the twelfth amplitude.

16. The method of any of claim 2, wherein the amplifier circuit comprises a third directional coupler, a transmitted port of the third directional coupler is connected to an input of the second amplifier, a coupled port of the third directional coupler is connected to an input of the third amplifier, and an isolated port of the third directional coupler is terminated, and the method comprises providing the second signal to an input port of the third directional coupler.

17. The method of any of claim 2, wherein the amplifier circuit comprises a fourth directional coupler, a transmitted port of the fourth directional coupler is connected to an input of the fourth amplifier, a coupled port of the fourth directional coupler is connected to an input of the fifth amplifier, and an isolated port of the fourth directional coupler is terminated, and the method comprises providing the third signal to an input port of the fourth directional coupler.

18. The method of any of claim 2, comprising providing the output of the first amplifier to the transmitted port of the first directional coupler via a first impedance transformer.

19. The method of any of claim 2, wherein the coupled port of the first directional coupler is connected to the transmitted port of the second directional coupler via a second impedance transformer.

20. An amplifier circuit comprising:
a first amplifier configured to receive a first signal;

a balanced amplifier comprising second and third ampli-
fiers and configured to receive a second signal; and
a first directional coupler; and
wherein an output of the first amplifier is connected to a
transmitted port of the first directional coupler, an
output of the second amplifier is connected to an input
port of the first directional coupler, an output of the
third amplifier is connected to an isolated port of the
first directional coupler, and a coupled port of the first
directional coupler is connected to an output of the
amplifier circuit; and
wherein the amplifier circuit is configured to:
   operate in a first output peak amplitude range of the
      amplifier circuit wherein, in the first output peak
      amplitude range, the first signal is based on a signal
to be amplified and has an amplitude that increases
      across the first output peak amplitude range from
      substantially zero to a first amplitude, and the second
      signal is substantially zero; and
   operate in a second output peak amplitude range of the
amplifier circuit, wherein the second output peak
      amplitude range is higher than the first output peak
      amplitude range and wherein, in the second output
      peak amplitude range, the first signal is based on the
      signal to be amplified and has an amplitude that
decreases across the second output peak amplitude
      range from the first amplitude to a second amplitude,
      and the second signal is based on the signal to be
      amplified and has an amplitude that increases across
      the second output peak amplitude range from a third
amplitude to a fourth amplitude.

* * * * *